United States Patent
Soejima et al.

(10) Patent No.: US 10,593,662 B2
(45) Date of Patent: Mar. 17, 2020

(54) PROTECTION DEVICE

(71) Applicant: KABUSHIKI KAISHA TOKAI RIKA DENKI SEISAKUSHO, Aichi (JP)

(72) Inventors: Narumasa Soejima, Aichi-ken (JP); Takashi Suzuki, Aichi-ken (JP); Kengo Shima, Aichi (JP); Yosuke Kanie, Aichi (JP); Kazuya Adachi, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 15/915,522

(22) Filed: Mar. 8, 2018

(65) Prior Publication Data

US 2018/0261592 A1   Sep. 13, 2018

(30) Foreign Application Priority Data

Mar. 10, 2017 (JP) .................................. 2017-046607

(51) Int. Cl.
*H01L 23/60* (2006.01)
*H01L 27/02* (2006.01)
(Continued)

(52) U.S. Cl.
CPC .......... *H01L 27/0292* (2013.01); *H01L 23/62* (2013.01); *H01L 23/642* (2013.01);
(Continued)

(58) Field of Classification Search
CPC ... H01L 27/0292; H01L 23/62; H01L 23/642; H01L 23/645; H01L 27/0251;
(Continued)

(56) References Cited

U.S. PATENT DOCUMENTS 5,901,022 A   5/1999 Ker
2008/0237789 A1   10/2008 He et al.
(Continued)

FOREIGN PATENT DOCUMENTS

JP   2015-198190   11/2015
WO   2010/108812 A1   9/2010
(Continued)

OTHER PUBLICATIONS

Extended European Search Report, dated Jul. 30, 2018, from the European Patent Office (EPO) in European Patent Application No. 18160880.3.

*Primary Examiner* — Matthew C Landau
*Assistant Examiner* — Dmitriy Yemelyanov
(74) *Attorney, Agent, or Firm* — Greenblum & Bernstein, P.L.C.

(57) ABSTRACT

A protection device includes a semiconductor substrate including a protection element; an insulating layer covering a surface of the semiconductor substrate; a conductive layer disposed in the insulating layer, and extending in a plane that is parallel with the surface of the semiconductor substrate; a passive element formed with an elongated conductor, curved in a plane that is parallel with the conductive layer, and located over the conductive layer; and an input terminal, an output terminal, and a ground terminal exposed in a surface of the insulating layer. One end of the passive element is electrically connected to the input terminal, the other end of the passive element and a high-potential-side terminal of the protection element are electrically connected to the output terminal, and a low-potential-side terminal of the protection element and the conductive layer are electrically connected to the ground terminal.

7 Claims, 8 Drawing Sheets

(51) Int. Cl.
  *H01L 23/64*  (2006.01)
  *H01L 23/62*  (2006.01)
  *H01L 49/02*  (2006.01)
  *H02H 9/04*  (2006.01)
  *H01L 29/74*  (2006.01)
  *H01L 29/866*  (2006.01)

(52) U.S. Cl.
  CPC ........ *H01L 23/645* (2013.01); *H01L 27/0251* (2013.01); *H01L 27/0255* (2013.01); *H01L 27/0288* (2013.01); *H01L 28/10* (2013.01); *H01L 28/20* (2013.01); *H02H 9/04* (2013.01); *H01L 29/74* (2013.01); *H01L 29/866* (2013.01)

(58) Field of Classification Search
  CPC . H01L 27/0255; H01L 27/0288; H01L 28/10; H01L 28/20; H01L 29/74; H01L 29/866; H02H 9/04
  See application file for complete search history.

(56) References Cited

U.S. PATENT DOCUMENTS

2011/0291231 A1* 12/2011 Jiang .................. H01L 23/5227
                                                          257/531
2014/0198417 A1   7/2014 Wang et al.

FOREIGN PATENT DOCUMENTS

WO         2011/037101  A1     3/2011
WO     WO-2011037101  A1 *   3/2011     ......... H01L 27/0288

* cited by examiner

PROTECTION DEVICE

CROSS-REFERENCE TO RELATED APPLICATION(S)

This application is based upon and claims the benefit of priority from prior Japanese patent application No. 2017-046607, filed on Mar. 10, 2017, the entire contents of which are incorporated herein by reference.

BACKGROUND

The technique disclosed in the present specification relates to a protection device for preventing overpower from flowing through a load circuit and, more particularly, to a technique for implementing, with a simple structure, a coil or a resistor and a capacitor of a lowpass filter for cutting a high-frequency waveform in an insulating layer of a semiconductor substrate in which a protection element that is turned on upon reception of overpower is formed.

Protection devices are known that are connected between a power source and a load circuit and protect the load circuit from overpower. Among such protection devices are ones in which a protection element that is a Zener diode or a combination of a Zener diode and a thyristor is formed in a semiconductor substrate. For example, JP-A-2015-198190 discloses a semiconductor substrate in which a protection element that is a combination of a Zener diode and a thyristor is formed.

To accommodate an input (noise or a surge current voltage) that is higher in frequency than a response band of a protection element, it is desirable to provide, in addition to the protection element, a lowpass filter including at least one of a coil, a resistor, and a capacitor between the input and output of a protection device. However, a protection device is made large in size if the protection device has such a lowpass filter separately from a semiconductor substrate.

SUMMARY

There is provided a technique for implementing, with a simple structure, a coil or a resistor and a capacitor of a lowpass filter for cutting a high-frequency input waveform in an insulating layer that covers a surface of a semiconductor substrate in which a protection element is formed. The coil, capacitor, and resistor are referred to as passive elements generically.

There is provided a protection device comprising: a semiconductor substrate in which a protection element that is configured to be turned on upon reception of overpower is formed; an insulating layer which covers a surface of the semiconductor substrate; a conductive layer which is disposed in the insulating layer, and which extends in a plane that is parallel with the surface of the semiconductor substrate; a passive element which is one of a coil and a resistor, the passive element which is formed with an elongated conductor, and which is curved so as to have a spiral or zigzag shape in a plane that is parallel with the conductive layer, and is located over the conductive layer; and an input terminal, an output terminal, and a ground terminal which are exposed in a surface of the insulating layer, wherein: one end of the passive element is electrically connected to the input terminal; the other end of the passive element and a high-potential-side terminal of the protection element are electrically connected to the output terminal; and a low-potential-side terminal of the protection element and the conductive layer are electrically connected to the ground terminal.

DETAILED DESCRIPTION OF EXEMPLARY EMBODIMENTS

Embodiment 1

Figure 1:
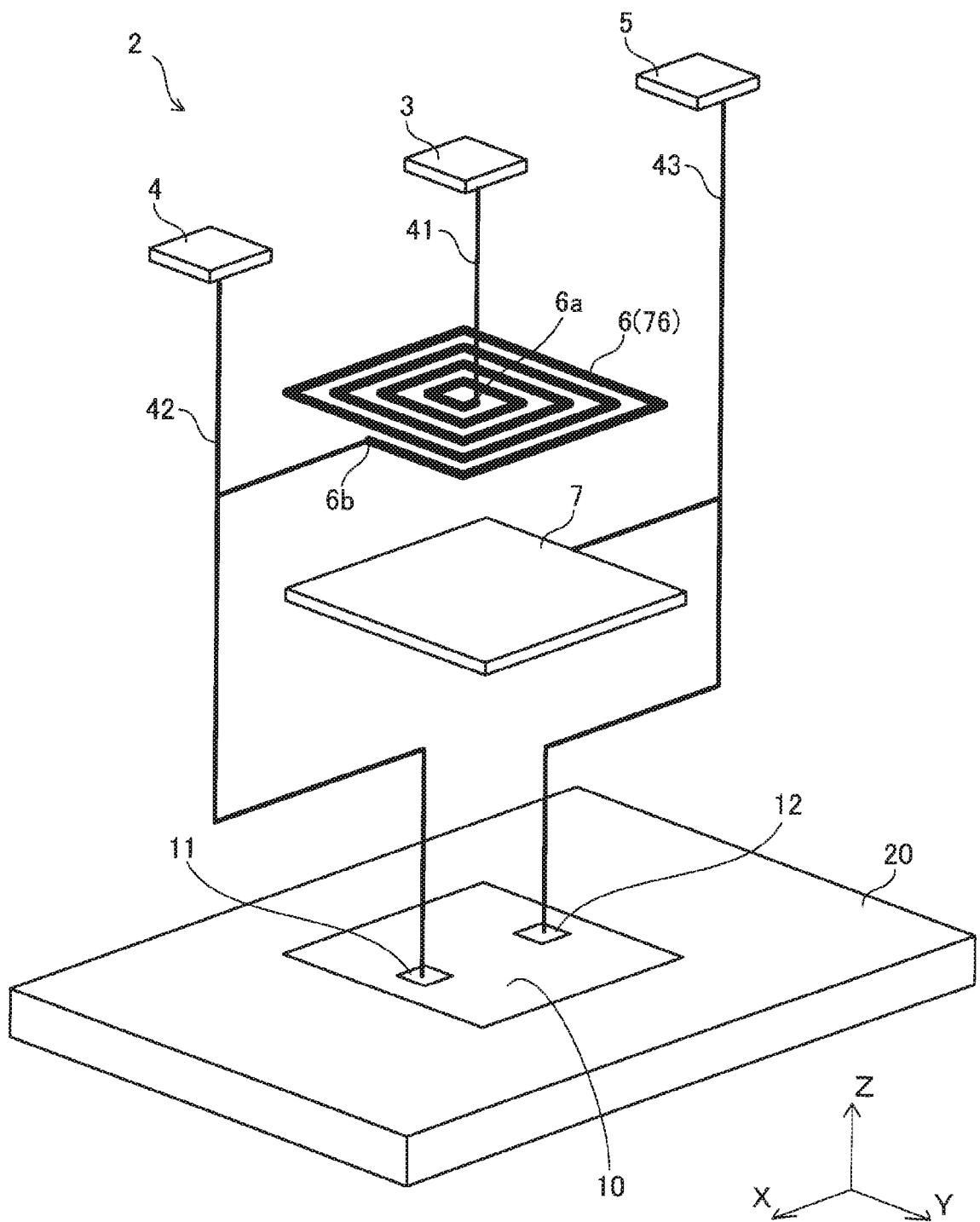
FIG. 1 is a schematic exploded view of a protection device according to a first embodiment.
Figure 2:
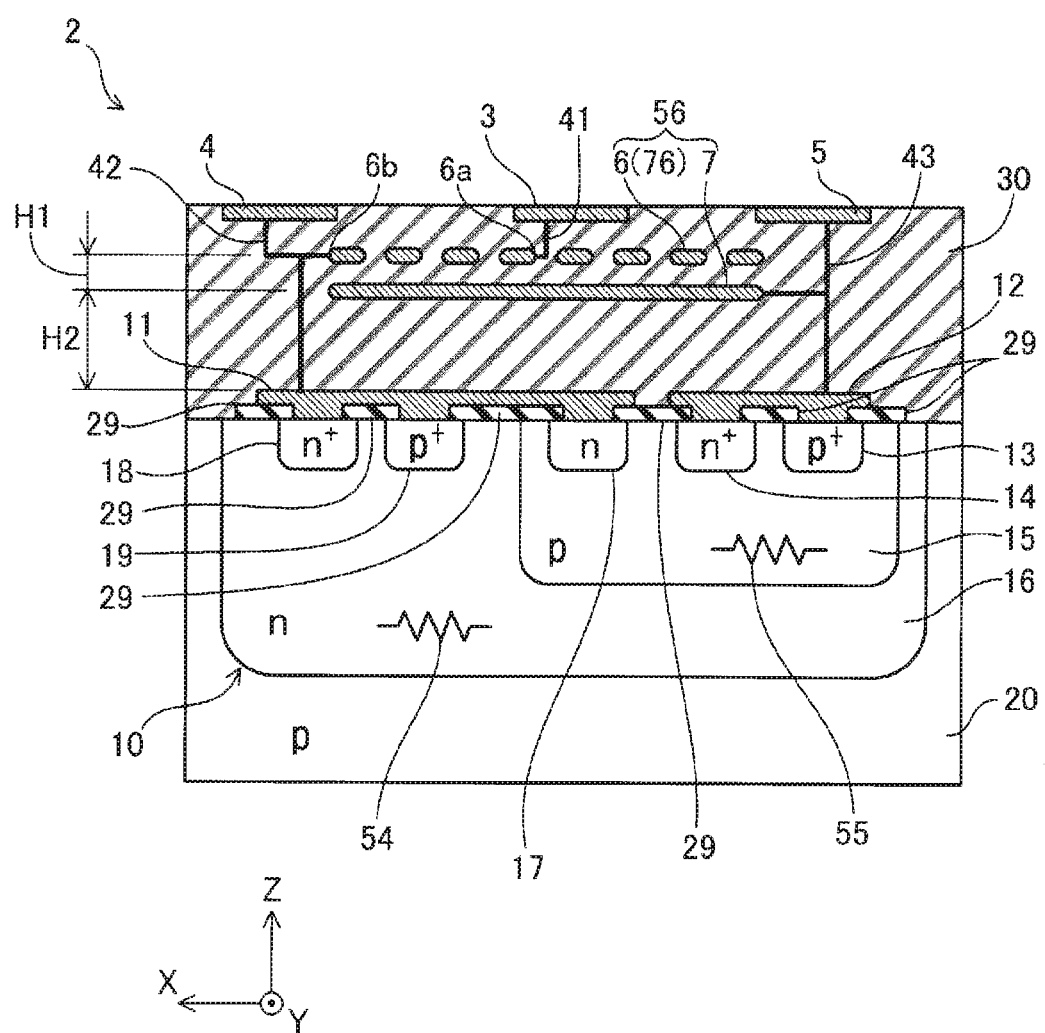
FIG. 2 is a sectional view of the protection device according to the first embodiment.
Figure 3:
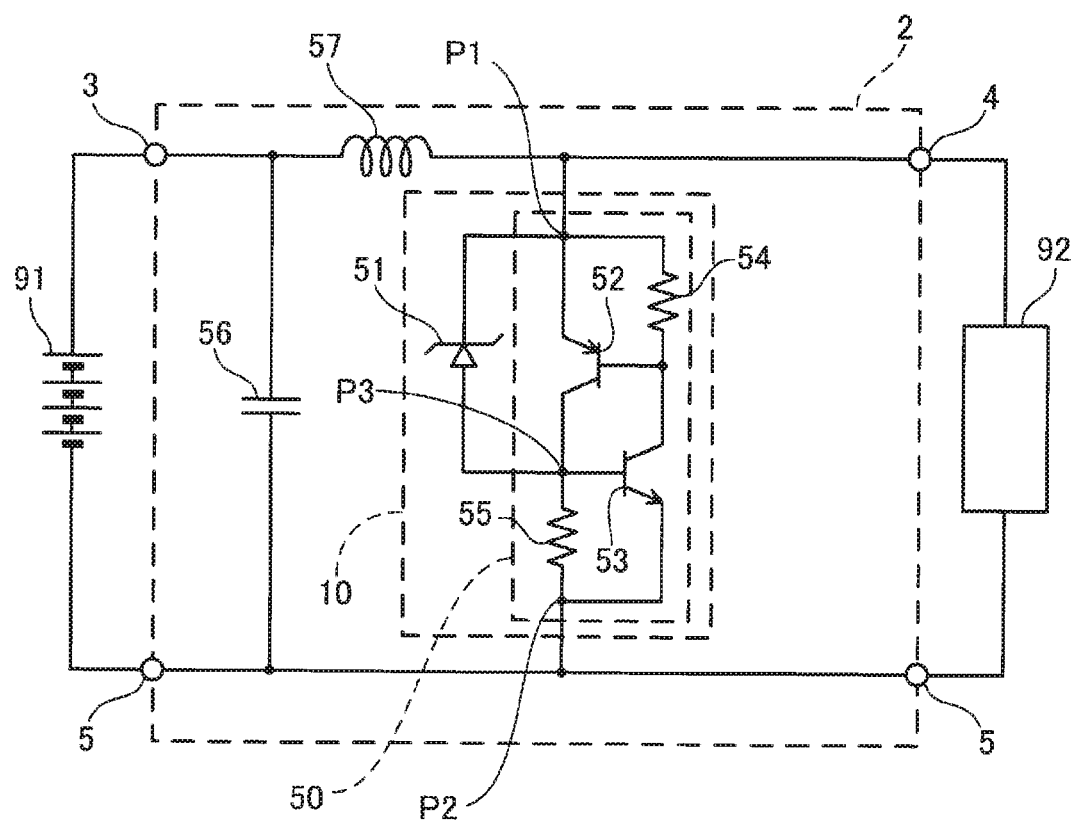
FIG. 3 is an equivalent circuit diagram of the protection device according to the first embodiment.

A protection device 2 according to a first embodiment will be described with reference to FIGS. 1 to 3. The protection device 2 is a device that is connected between a power source and a load circuit and protects the load circuit by short-circuiting when an overvoltage is applied from the power source to the load circuit. The protection device 2 is composed of a protection element 10 formed in a semiconductor substrate 20 and a passive element disposed in an insulating layer 30 that covers the semiconductor substrate 20. FIG. 1 is a schematic exploded perspective view of the protection device 2. To facilitate understanding of the structure of plural conductors provided in the insulating layer 30, in FIG. 1 the insulating layer 30 is omitted and the conductors are shown in an exploded manner. It is noted that in actuality some of the conductors are formed by etching or the like and are not separable from the insulating layer 30. A spiral, very thick line in FIG. 1 represents a coil 6 that is formed with an elongated conductor 76. Thick lines 41 to 43 in FIGS. 1 and 2 represent connection lines each of which connects conductors electrically. It is noted that each of the connection lines 41 to 43 shown in in FIG. 1 indicates an electrical connection relationship between conductors and does not indicate a physical structure. FIG. 2 is a sectional view of the protection device 2, and shows a cross section taken by cutting the protection device 2 by a plane that is parallel with an XZ plane in the coordinate system shown in FIG. 1. Cross sections of an input terminal 3, an output terminal 4, and a ground terminal 5 (described later) appear in FIG. 2. Although the input terminal 3, the output terminal 4, and the ground terminal 5 need not be arranged on a straight line, to facilitate understanding and for the sake of convenience, in FIG. 2 they are drawn so as to appear in a single cross section. Likewise, the connection lines 41 to 43 may be implemented so as not to appear in the cross section of FIG. 2. In FIG. 2, to facilitate understanding, the cross section of the semiconductor substrate 20 is not hatched. FIG. 3 is an equivalent circuit diagram of the protection device 2.

The circuit configuration of the protection device 2 will be described below with reference to FIG. 3. The protection device 2 is connected between a power source 91 and a load circuit 92. The protection device 2 includes the input terminal 3, the output terminal 4, and the ground terminal 5. The input terminal 3 is connected to the positive terminal of the power source 91. The output terminal 4 is connected to the power input positive terminal of the load circuit 92. The negative terminal of the power source 91 and the negative terminal of the load circuit 92 are connected to the ground terminal 5 which is common to the input side and the output side.

The protection device 2 is equipped with the protection element 10 which is turned on upon reception of an overvoltage a capacitor 56, and a coil 57. The protection element 10 is connected between the output terminal 1 and the ground terminal 5, and connects them when turned on. The protection element 10 is composed of a thyristor 50 and a Zener diode 51. The anode of the thyristor 50 is connected to the cathode of the Zener diode 51 at point P1 shown in FIG. 3. The anode of the thyristor 50 (point P1) is connected to the input terminal 3 via the coil 57 and also to the output terminal 4. The cathode of the thyristor 50 is connected to the ground terminal 5 at point P2 shown in FIG. 3. The gate of the thyristor 50 is connected to the anode of the Zener diode 51 at point P3 shown in FIG. 3. Points P1 and P2 correspond to a high-potential-side terminal and a low-potential-side terminal of the protection element 10, respectively. When an overvoltage is applied to the input terminal 3, the Zener diode 51 breaks down to turn on the thyristor 50, whereby the input terminal 3 and the ground terminal 5 are conducted with each other. The thyristor 50 is a circuit that a pnp transistor 52, an npn transistor 53, and resistors 54 and 55 are connected together as shown in the equivalent circuit diagram of FIG. 3. In other words, the protection element 10 is a device whose high-potential-side terminal 11 and low-potential-side terminal 12 are turned on upon reception of an overvoltage.

The capacitor 56 is connected between the input terminal 3 and the ground terminal 5, and the coil 57 is connected between the input terminal 3 and the output terminal 4. The capacitor 56 and the coil 57 constitute what is called an LC lowpass filter. The LC lowpass filter cuts an input having a frequency that is higher than an operation frequency of the protection element 10, and thereby prevents high-frequency noise or a surge voltage/current from reaching the protection element 10 or the load circuit 92.

The hardware of the protection device 2 whose equivalent circuit is shown in FIG. 3 will be described below with reference to FIGS. 1 and 2. The protection element 10 is formed in the semiconductor substrate 20 which is of a p type. The specific configuration of the protection element 10 will be described later with reference to FIG. 2. The high-potential-side terminal 11 and the low-potential-side terminal 12, which correspond to points P1 and P2 of the equivalent circuit shown in FIG. 3, respectively, of the protection element 10 are exposed in the surface of the semiconductor substrate 20. The insulating layer 30 is provided so as to cover the surface of the semiconductor substrate 20 (i.e., the surface of the protection element 10). As mentioned above, the insulating layer 30 is omitted in FIG. 1 but shown in FIG. 2. In FIG. 2, to increase its legibility, the insulating layer 30 is hatched by light gray, thick slanting lines.

A conductive layer 7 is formed inside the insulating layer 30. The conductive layer 7 is located over the protection element 10 so as to extend in an XY plane that is parallel with the surface of the semiconductor substrate 20. The coil 6 is disposed over the conductive layer 7 inside the insulating layer 30. The coil 6 is a passive element that is formed by curving an elongated conductor 76 into a spiral shape. The coil 6 extends in a plane that is parallel with the conductive layer 7 so as to have a spiral shape. The coil 6 extends two-dimensionally so as to be opposed to the conductive layer 7. Each of the conductive layer 7 and the coil 6 is formed by, for example, etching a metal (aluminum) plate.

The input terminal 3, the output terminal 4, and the ground terminal 5 are exposed in the surface of the insulating layer 30. The input terminal 3 and one end 6a of the coil 6 are electrically connected to each other by the connection line 41. The other end 6b of the coil 6, the output terminal 4 and the high-potential-side terminal 11 of the protection element 10 are electrically connected to each other by the connection line 42. The low-potential-side terminal 12 of the protection element 10, the conductive layer 7 and the ground terminal 5 are electrically connected to each other by the connection line 43. As mentioned above, it is noted that each of the connection lines 41 to 43 indicates an electrical connection relationship between conductors and does not indicate a physical structure. In the embodiment, each of the connection lines 41 to 43 is implemented inside the insulating layer 30 by, for example, etching a metal (aluminum) plate.

The coil 6 which is connected between the input terminal 3 and the output terminal 4 corresponds to the coil 57 of the equivalent circuit shown in FIG. 3. Since the insulating layer 30 has certain permittivity, a parasitic capacitance (floating capacitance) exists between two conductors that are spaced from each other inside the insulating layer 30 and a capacitor is formed there. Separated from and opposed to each other inside the insulating layer 30, the conductive layer 7 and the coil 6 constitute a capacitor because of a parasitic capacitance occurring between them. The capacitor formed by the coil 6 and the conductive layer 7 corresponds to the capacitor 56 of the equivalent circuit shown in FIG. 3. That is, the LC lowpass filter (coil 57 and capacitor 56) of the equivalent circuit shown in FIG. 3 is implemented by the two conductors, that is, the coil 6 and the conductive layer 7. The protection device 2 according to the first embodiment is equipped with the LC lowpass filter which is located upstream of the protection element 10. The LC lowpass filter is implemented by the two conductors (coil 6 and conductive layer 7) which are formed inside the insulating layer 30 which covers the surface of the semiconductor substrate 20.

A parasitic capacitance also exists between the conductive layer 7 and the protection element 10 (in particular, high-potential-side terminal 11 and low-potential-side terminal 12), and a capacitor is formed there. However, the interval H1 between the conductive layer 7 and the coil 6 is shorter than the interval H2 between the conductive layer 7 and the protection element 10 (high-potential-side terminal 11 and low-potential-side terminal 12). Furthermore, the total area of the high-potential-side terminal 11 and the low-potential-side terminal 12 is smaller than that of the coil 6 obtained when the semiconductor substrate 20 is viewed from above. Thus, the parasitic capacitance occurring between the conductive layer 7 and the coil 6 is larger than that occurring between the conductive layer 7 and the protection element 10. Since the parasitic capacitance occurring between the conductive layer 7 and the coil 6 is dominant over that occurring between the conductive layer 7 and the protection element 10, the influence of the parasitic capacitance occurring between the conductive layer 7 and the protection element 10 is small.

The configuration of the protection element 10 will be described below with reference to FIG. 2. The whole protection element 10 is formed in an n-type well region 16 which is formed in the p-type semiconductor substrate 20. A p-type well region 15 is formed in the n-type well region 16 so as to be exposed in the surface of the semiconductor substrate 20. An n+ cathode region 14, a p+ contact region 13, and an n-type Zener cathode region 17 are formed in the p-type well region 15 so as to be exposed in the surface of the semiconductor substrate 20. The n+ cathode region 14, the p-type well region 15, and the n-type well region 16 constitute an npn transistor that corresponds to the transistor 53 of the equivalent circuit shown in FIG. 3. The p-type well region 15 also serves as the resistor 55 of the equivalent circuit shown in FIG. 3.

The low-potential-side terminal 12 is in contact with the n+ cathode region 14 and the p+ contact region 13. A portion of another insulating layer 29 is sandwiched between the low-potential-side terminal 12 and the p-type well region 15 to insulate them from each other. The p+ contact region 13 is formed to establish ohmic contact between the low-potential-side terminal 12 and the p-type well region 15.

A p+ anode region 19 and an n+ contact region 18 are formed in the n-type well region 16 so as to be exposed in the surface of the semiconductor substrate 20. The p+ anode region 19, the n-type well region 16, and the p-type well region 15 constitute a pnp transistor that corresponds to the transistor 52 of the equivalent circuit shown in FIG. 3. The n-type well region 16 also serves as the resistor 54 of the equivalent circuit shown in FIG. 3. The above-mentioned npn transistor and this pnp transistor constitute a thyristor, that is, the thyristor 50 of the equivalent circuit shown in FIG. 3.

The p+ anode region 19, the n+ contact region 18, and the n-type Zener cathode region 17 are in contact with the high-potential-side terminal 11. A portion of the another insulating layer 29 is sandwiched between the high-potential-side terminal 11 and the n-type well region 16 or the p-type well region 15 to insulate the high-potential-side terminal 11 from both of the well regions 15 and 16. The n+ contact region 18 is formed to establish ohmic contact between the high-potential-side terminal 11 and the n-type well region 16. The another insulating layer 29 and the insulating layer 30 may be either made of the same material at the same time or made of different materials.

The n-type Zener cathode region 17 and the p-type well region 15 constitute the Zener diode 51 of the equivalent circuit shown in FIG. 3. As described above, the protection element 10 shown in FIG. 2 corresponds to the protection element 10 shown in FIG. 3. When the Zener diode 51 (see FIG. 3) which is formed by the n-type Zener cathode region 17 and the p-type well region 15 breaks down upon application of an overvoltage between the high-potential-side terminal 11 and the low-potential-side terminal 12, the thyristor 50 (see FIG. 3) is turned on, whereby the high-potential-side terminal 11 and the low-potential-side terminal 12 are conducted with each other.

Modification

Figure 4:
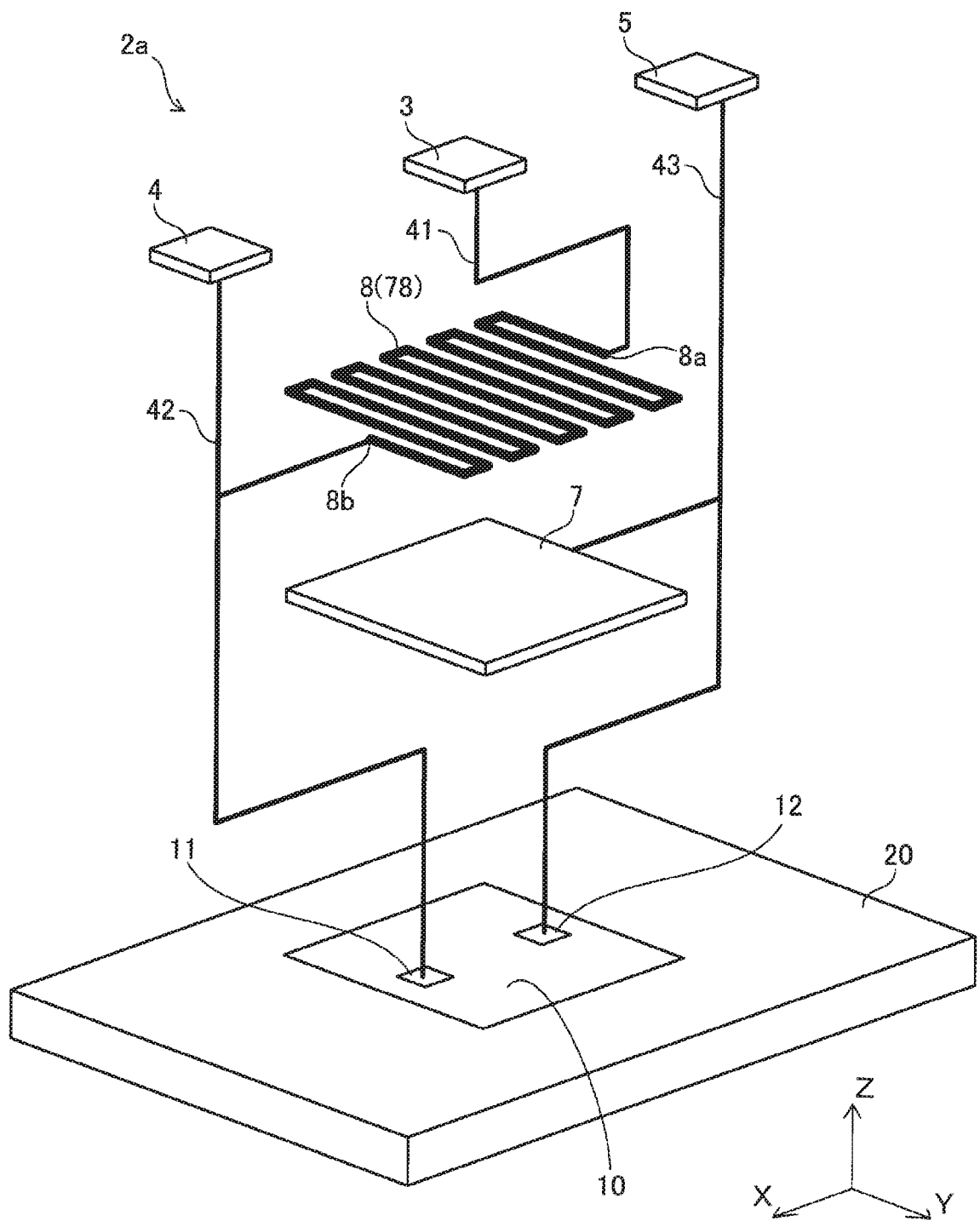
FIG. 4 is a schematic exploded view of a protection device according to a modification of the first embodiment.

Next, a protection device 2a which is a modified version of the protection device 2 shown in FIGS. 1 to 3 will be described. FIG. 4 is a schematic exploded perspective view of the protection device 2a according to a modification and corresponds to the schematic exploded perspective view of FIG. 1. In this modification, the coil 6 of the protection device 2 is replaced by a resistor 8. More specifically, one end 8a of the resistor 8 is electrically connected to the input terminal 3 and the other end 8b of the resistor 8 and the high-potential-side terminal 11 of the protection element 10 are electrically connected to the output terminal 4. The other connection relationships are the same as in the protection device 2 shown in FIGS. 1 to 3. The resistor 8 is formed by snaking an elongated conductor 78 which is larger in resistivity than ordinary conductors and has a proper resistance. The elongated conductor 78 which constitutes the resistor 8 is curved so as to have a zigzag shape in a plane that is parallel with the conductive layer 7, is located over the conductive layer 7, and extends two-dimensionally so as to be opposed to the conductive layer 7. Like the above-described coil 4, the resistor 8 forms a capacitor together with the conductive layer 7 using a parasitic capacitance which occurs between them. The protection device 2a according to the modification shown in FIG. 4 is equipped with the snaked elongated conductor 78 and the conductive layer which constitute an RC lowpass filter that is formed by replacing the coil 57 with the resistor 8 in the equivalent circuit shown in FIG. 3.

Embodiment 2

Figure 5:
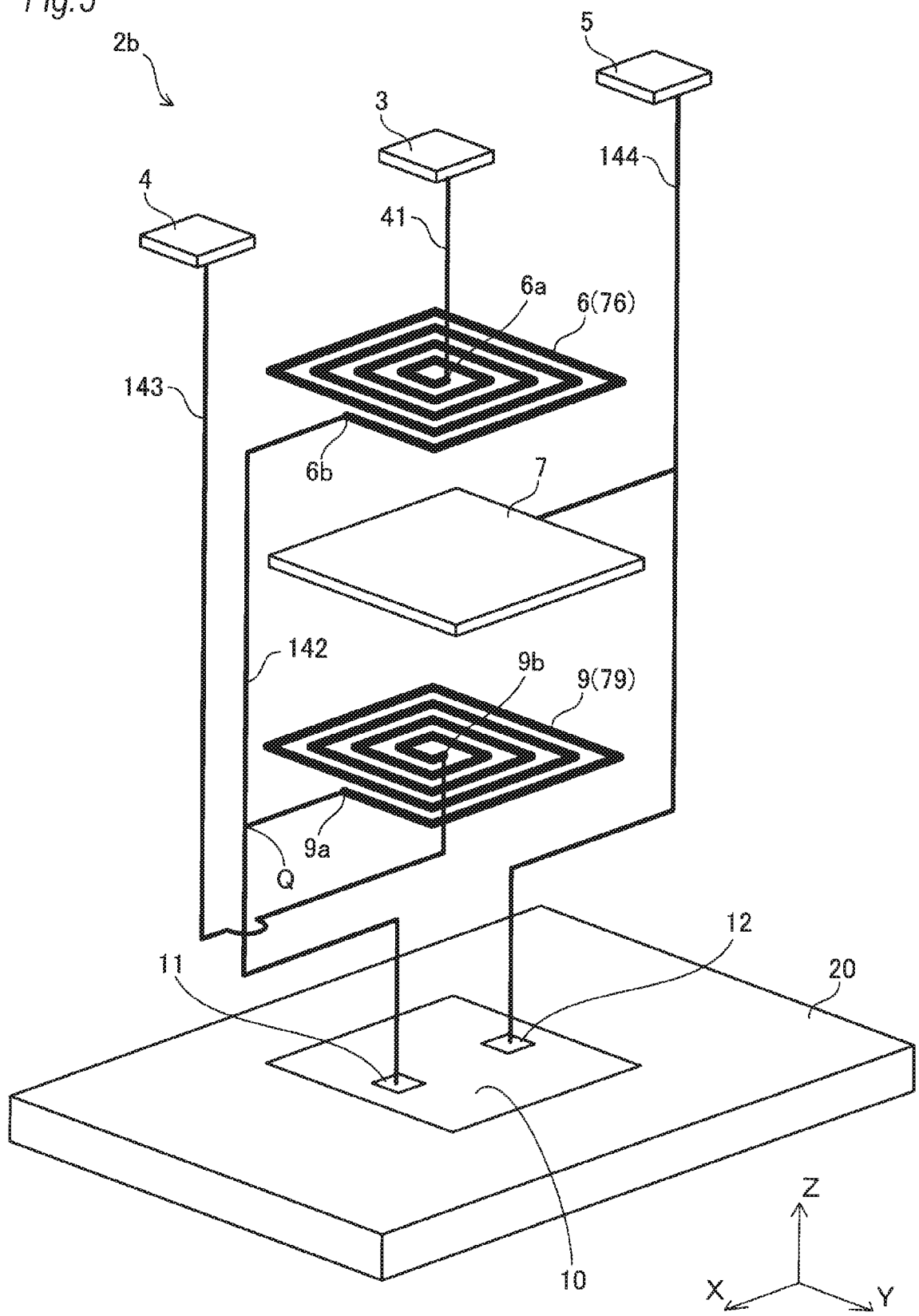
FIG. 5 is a schematic exploded view of a protection device according to a second embodiment.
Figure 6:
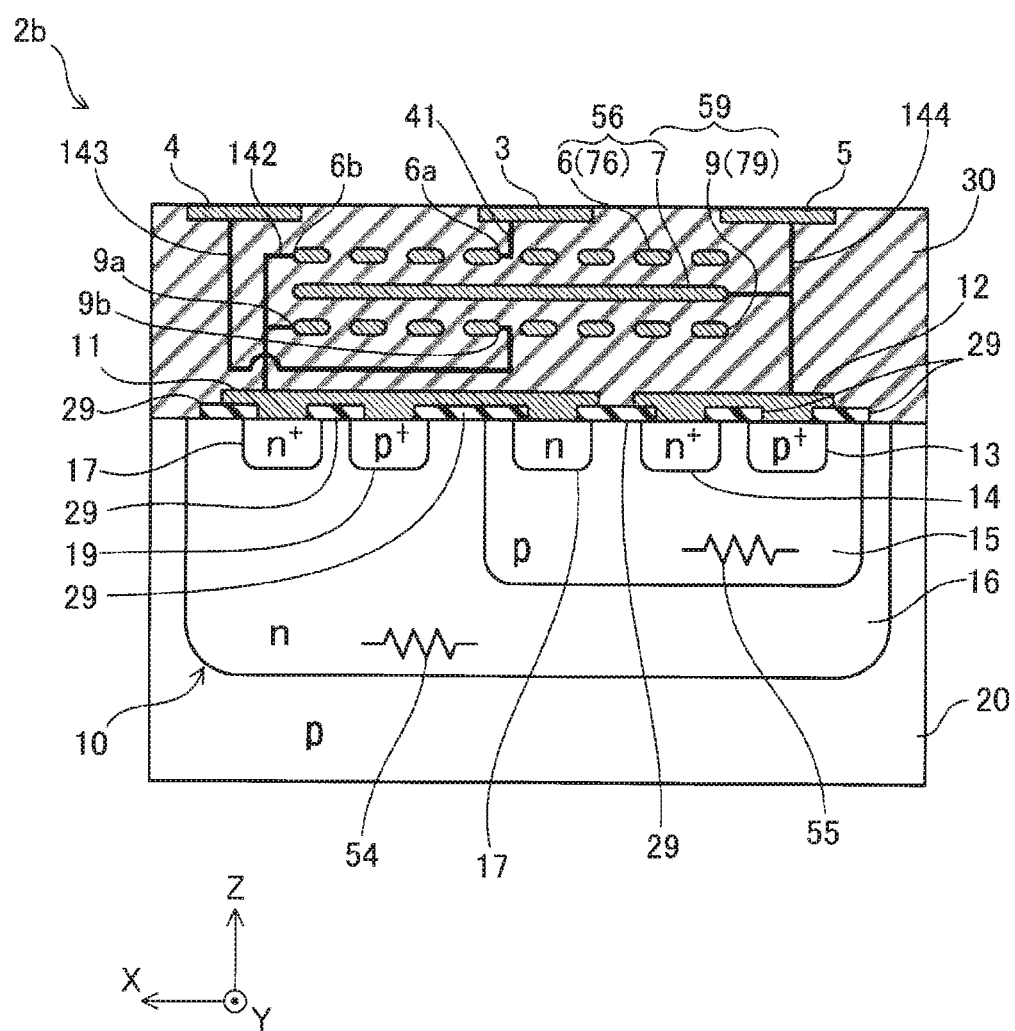
FIG. 6 is a sectional view of the protection device according to the second embodiment.
Figure 7:
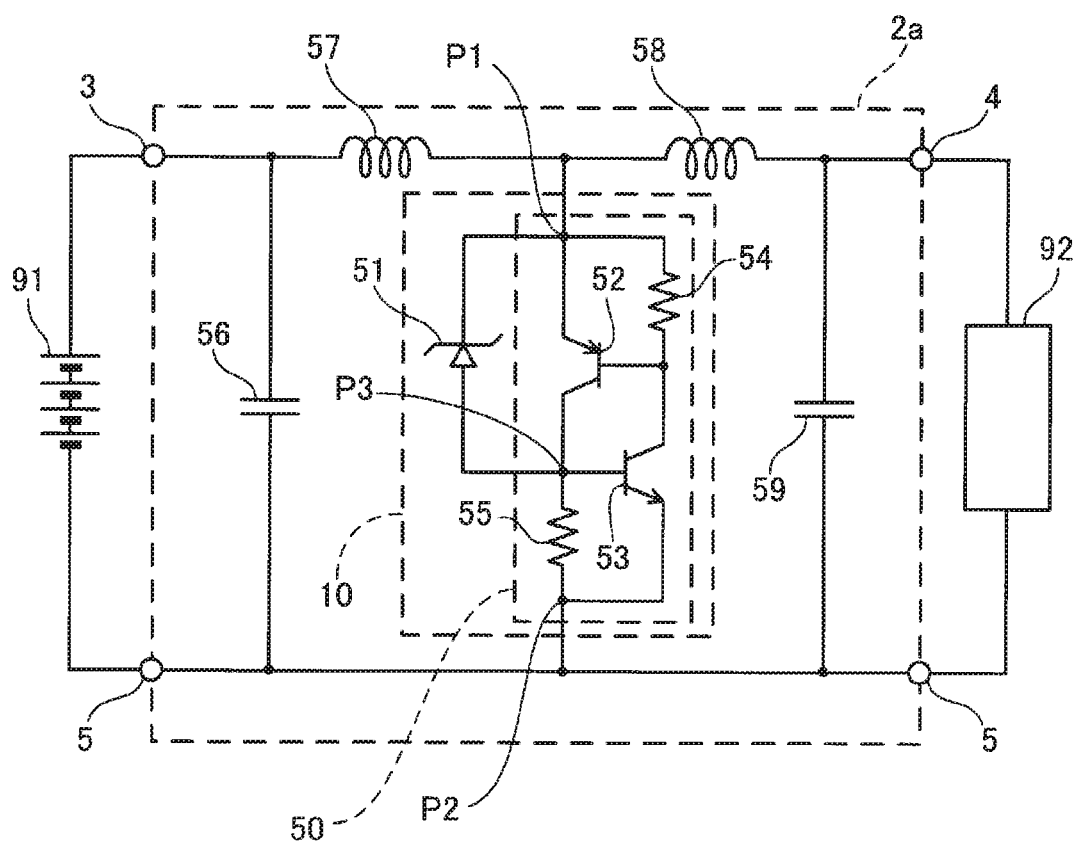
FIG. 7 is an equivalent circuit diagram of the protection device according to the second embodiment.

A protection device 2b according to a second embodiment will be described below with reference to FIGS. 5 to 8. The protection device 2b according to the second embodiment is obtained by adding a second coil 9 to the protection device 2 according to the first embodiment. For convenience of description, the coil 6 of the protection device 2 according to the first embodiment will be hereinafter referred to as a first coil 6. FIG. 5 is a schematic exploded perspective view of the protection device 2b according to the second embodiment. FIG. 6 is a sectional view of the protection device 2b. FIG. 7 is an equivalent circuit diagram of the protection device 2b. FIGS. 5 to 7 correspond to FIGS. 1 to 3, respectively. In FIGS. 5 to 7, components of the protection device 2b having the same ones in FIGS. 1 to 3 are given the same reference symbols as the latter and will not be described in detail.

The second coil 9 is formed between the conductive layer 7 and the semiconductor substrate 20 in the insulating layer 30. The second coil 9 is formed by curving an elongated conductor 79 into a spiral shape in a plane that is parallel with the conductive layer 7. The spiral elongated conductor 79 (second coil 9) extends two-dimensionally so as to be opposed to the conductive layer 7. One end 9a of the second coil 9 is connected to the connection point (point Q shown in FIG. 5) of the other end 6b of the first coil 6 and the high-potential-side terminal 11 of the protection element 10, and the other end 9h of the second coil 9 is connected to the output terminal 4. In other words, the second coil 9 is electrically connected between the connection point (point Q shown in FIG. 5 of the high-potential-side terminal 11 and the first coil 6, and the output terminal 4 in the protection device 2 according to the first embodiment. The second coil 9 and the conductive layer 7 also form a capacitor utilizing a parasitic capacitance occurring between them.

It is noted that as in the case of FIG. 1 each of thick lines 41 and 142 to 144 shown in FIGS. 5 and 6 indicates an electrical connection relationship between conductors and does not indicate a physical structure. Connection relationships between the components will be described below. The input terminal 3 is electrically connected to one end 6a of the first coil 6 by a connection line 41. The other end 6b of the first coil 6, the one end of the second coil 9a, and the high-potential-side terminal 11 of the protection element 10 are electrically connected to each other by a connection line 142. The other end 9b of the second coil 9 and the output terminal 4 are electrically connected to each other by a connection line 143. The low-potential-side terminal 12 of the protection element 10, the conductive layer 7, and the ground terminal 5 are electrically connected to each other by a connection line 144.

A capacitor 59 of the equivalent circuit shown in FIG. 7 corresponds to the capacitor that is formed by the second coil 9 and the conductive layer 7. A coil 58 shown in FIG. 7 corresponds to the second coil 9. As in the case of the protection device 2 according to the first embodiment, the conductive layer 7 and the first coil 6 correspond to the capacitor 56 of the equivalent circuit shown in FIG. 7, and the elongated conductor 76 (first coil 6) corresponds to the coil 57 of the equivalent circuit. As seen from the equivalent circuit shown in FIG. 7, the first coil 6 and the conductive layer 7 correspond to the coil 57 and the capacitor 56 of the equivalent circuit, and function as an LC lowpass filter that is located upstream of the protection element 10. The elongated conductor 79 (second coil 9) and the conductive layer 7 correspond to the coil 58 and the capacitor 59 of the equivalent circuit, and function as an IC lowpass filter that is located downstream of the protection element 10. Thus, in the protection device 2b according to the second embodiment, the three conductive members (two elongated conductors 76 and 79 and the conductive layer 7) constitute the four passive elements (two coils 57 and 58 and two capacitors 56 and 59) of the equivalent circuit.

Figure 8:
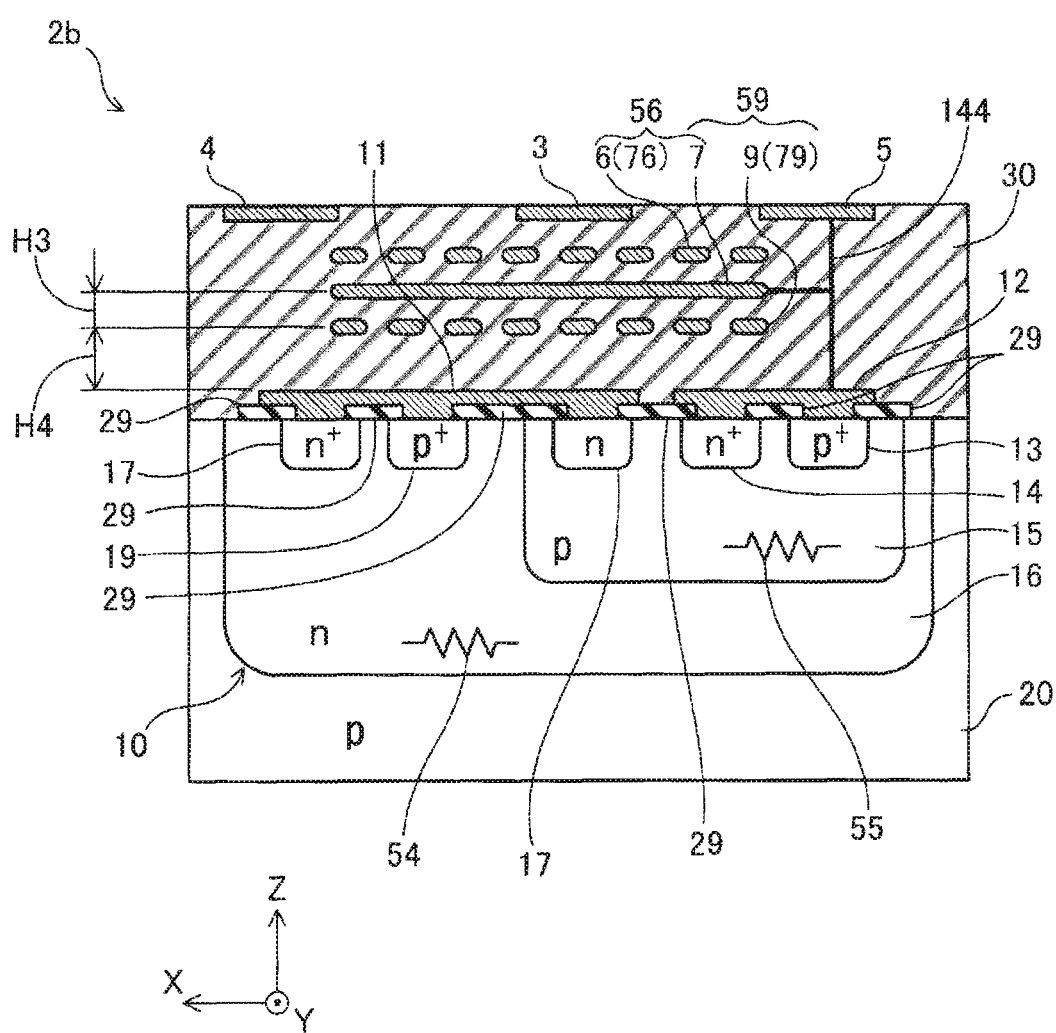
FIG. 8 is another sectional view of the protection device according to the second embodiment and illustrates an interval between a second coil and a protection element and an interval between the second coil and a conductive layer.

FIG. 8 is a sectional view in which the connection lines 41, 142, and 143 are omitted. The interval H3 between the conductive layer 7 and the second coil 9 (elongated conductor 79) is shorter than the interval H4 between the second coil 9 (elongated conductor 79) and the protection element 10 (high-potential-side terminal 11 and low-potential-side terminal 12). The total area of the high-potential-side terminal 11 and the low-potential-side terminal 12 is smaller than that of the second coil 9 (elongated conductor 79) obtained when the semiconductor substrate 20 is viewed from above. Thus, the parasitic capacitance occurring between the conductive layer 7 and the second coil 9 is larger than that occurring between the second coil 9 and the protection element 10. Since the parasitic capacitance occurring between the conductive layer 7 and the second coil 9 (elongated conductor 79) is dominant over that occurring between the second coil 9 (elongated conductor 79) and the protection element 10, the influence of the parasitic capacitance between the second coil 9 (elongated conductor 79) and the protection element 10 is small.

What should be pointed out about the techniques according to the embodiments and the modification will be described below. The first coil 6 and/or the second coil 9 of the protection device 2b according to the second embodiment may be replaced by the resistor 8 shown in FIG. 4 to form an RC lowpass filter.

In the protection device 2 according to the first embodiment, the interval H1 between the coil 6 and the conductive layer 7 is shorter than the interval between the coil 6 and the protection element 10, and hence the parasitic capacitance between the coil 6 and the conductive layer 7 is larger than that between the coil 6 and the protection element 10. It suffices that the parasite capacitance between the coil 6 and the conductive layer 7 be larger than that between the coil 6 and the protection element 10. Each parasitic capacitance may be adjusted either using the interval between the conductors or using the permittivity between the conductors or the area of the conductors opposed to each other.

The coil 6 employed in the first embodiment, the resistor 8 employed in the modification of the first embodiment, and the first coil 6 and the second coil 9 employed in the second embodiment are examples of the passive elements disposed in the insulating layer 30.

The protection element 10 which is turned on upon reception of an overvoltage is formed in the semiconductor substrate 20 of each of the protection devices 2, 2a, and 2b according to the first embodiment, its modification, and the second embodiment. A Typical example of the protection element that is turned on upon reception of an overvoltage is a Zener diode or a combination of a Zener diode and a thyristor (employed in the embodiments and the modification). The technique disclosed in the present specification may employ another type of protection element such as one that is turned on upon reception of an overcurrent. Put generically, the protection element that is formed in the semiconductor substrate 20 may be an element that is turned on upon reception of overpower.

A protection device disclosed in the present specification includes a semiconductor substrate, an insulating layer, a conductive layer, and a passive element. A protection element that is configured to be turned on upon reception of overpower is formed in the semiconductor substrate. The insulating layer is formed on a surface of the semiconductor substrate so as to cover the protection element. In the following description, for convenience of explanation, the direction going from the boundary between the semiconductor substrate and the insulating layer toward the surface of the insulating layer is defined as an upward direction. The conductive layer is disposed in the insulating layer and located over the protection element and extends in a plane that is parallel with the surface of the semiconductor substrate. The passive element is a coil or a resistor that is formed with an elongated conductor, and is disposed over the conductive layer in the insulating layer. Where the passive element is a coil, the elongated conductor extends so as to have a spiral shape in a plane that is parallel with the conductor layer. Where the passive element is a resistor, the elongated conductor is curved so as to have a zigzag shape in a plane that is parallel with the conductor layer. In either case, the passive element which is formed with the elongated conductor extends two-dimensionally so as to be opposed to the conductive layer. The protection device disclosed in the present specification further includes an input terminal, an output terminal, and a ground terminal that are exposed in a surface of the insulating layer. One end of the passive element is electrically connected to the input terminal. The other end of the passive element and a high-potential-side terminal of the protection element are electrically connected to the output terminal. A low-potential-side terminal of the protection element and the conductive layer are electrically connected to the ground terminal.

In the above protection device, the passive element, which extends two-dimensionally so as to be opposed to the conductive layer, and the conductive layer constitute capacitor utilizing a parasitic capacitance occurring between them. The elongated conductor and the conductive layer constitute a coil (or resistor) and a capacitor of a lowpass filter. Usually, a capacitor requires two conductors (two electrodes), and a coil (or resistor) requires one conductor. In the above protection device, the coil (or resistor) and the capacitor can be formed in the insulating layer using the two conductors (elongated conductor and conductive layer). And a lowpass filter of an IC type (coil and capacitor) or an RC type (resistor and capacitor) having a simple structure can be implemented in the insulating layer compactly.

The protection device disclosed in the present specification may further include another passive element. The another passive element is a coil or a resistor that is formed with another elongated conductor. The another passive element is disposed between the conductive layer and the semiconductor substrate in the insulating layer so as to be opposed to the conductive layer. Where the another passive element is a coil, the another elongated conductor extends so as to have a spiral shape in a plane that is parallel with the conductor layer. Where the another passive element is a resistor, the another elongated conductor is curved so as to have a zigzag shape in a plane that is parallel with the conductor layer. In either case, the another passive element extends two-dimensionally so as to be opposed to the conductive layer. The another passive element is electrically connected between a connection point of the other end of the passive element and the high-potential-side terminal of the protection element, and the output terminal. Another capacitor is formed utilizing a parasitic capacitance occurring between the another elongated conductor and the conductive layer. The another elongated conductor that constitutes the another passive element, and the conductive layer constitute another lowpass filter (LC type or RC type) that is connected between the protection element and the output terminal. In the protection device which includes the another elongated conductor, LC (or RC) lowpass filters can be implemented upstream of and downstream of the protection element, respectively, by means of three conductors (two elongated conductors and conductive layer).

The protection device disclosed in the present specification positively utilizes the parasitic capacitance (s) occurring between the elongated conductor (s) and the conductive layer. On the other hand, where plural conductors are disposed in a thin insulating layer, unintended parasitic capacitances may occur between the plural conductors. In a protection device, if an unintended parasitic capacitance occurs between conductors disposed in an insulating layer, high-frequency noise or a surge may propagate from a power source to a protection element or a load circuit via the parasitic capacitance. In the protection device disclosed in the present specification, the capacitor of the lowpass filter is realized by positively utilizing the parasitic capacitance occurring between the conductive layer disposed in the insulating layer and the elongated conductor that extends two-dimensionally parallel with the conductive layer in the insulating layer. In another mode of the protection device, the capacitor of the another lowpass filter is realized by utilizing the parasitic capacitance occurring between the conductive layer and the another elongated conductor that extends two-dimensionally parallel with the conductive layer on the side opposite to the above elongated conductor in the insulating layer. In either case, since only the conductive layer and the elongated conductor that is parallel with the conductive layer are used, the probability that a parasitic capacitance other than the parasitic capacitance (s) to be utilized positively occurs unintentionally is low.

Only one parasitic capacitance that may occur in the protection device is one that may occur between the protection element formed in the semiconductor substrate and the conductive layer. In view of this, in the protection device disclosed in the present specification, it is desirable that the conductors are disposed so that the parasitic capacitance between the elongated conductor and the conductive layer is larger than that between the protection element and the conductive layer. Where the another elongated conductor is provided, it is desirable that the parasitic capacitance between the another elongated conductor and the conductive layer is larger than that between the protection element and the another elongated conductor. The magnitude of each parasitic capacitance can be set by, for example, adjusting the interval between the elongated conductor and the conductive layer. Where the above relationship between the parasitic capacitances is satisfied, the parasitic capacitance between the conductive layer and the elongated conductor (or capacitance between the conductive layer and the another elongated conductor) is dominant, whereby the influence of the parasitic capacitance between the conductive layer and the protection element (or the another elongated conductor and the protection element) can be made small.

The protection element which is formed in the semiconductor substrate may be a Zener diode or a circuit including a Zener diode. An example of the circuit including a Zener diode is a protection circuit that is a combination of a Zener diode and a thyristor.

Although the specific examples of the invention have been described above in detail, they are just examples and should not be construed as restricting the scope of the claims. The scope of the claims encompasses versions modified or changed in various manners of the specific examples described above. The technical elements described in the specification and drawings exhibit their technical utility individually or when combined with other elements, and are not restricted to the cases that they are used to form the combinations described in the claims of the application. Furthermore, the techniques described in the specification and the drawings are such as to be able to attain plural objects simultaneously and are technically useful even in that they can attain each of those objects.

What is claimed is:

1. A protection device, comprising: a semiconductor substrate in which a protection element that is configured to be turned on upon reception of overpower is formed; an insulating layer which covers a surface of the semiconductor substrate; a conductive layer which is disposed in the insulating layer, and which extends in a plane that is parallel with the surface of the semiconductor substrate; a passive element which is one of a coil and a resistor, the passive element which is formed with an elongated conductor, and which is curved so as to have a spiral or zigzag shape in a plane that is parallel with the conductive layer, and is located over the conductive layer; another passive element that is the other of the coil and the resistor, the another passive element formed with another elongated conductor, and is curved so as to have a spiral or zigzag shape in a plane that is parallel with the conductive layer, is located between the conductive layer and the semiconductor substrate, the another passive element being electrically connected between a connection point of the other end of the passive element and the high-potential-side terminal, and the output terminal; and an input terminal, an output terminal, and a ground terminal which are exposed in a surface of the insulating layer, wherein one end of the passive element is electrically connected to the input terminal; the other end of the passive element and a high-potential-side terminal of the protection element are electrically connected to the output terminal, a low-potential-side terminal of the protection element and the conductive layer are electrically connected to the ground terminal, a parasitic capacitance occurring between the another elongated conductor and the conductive layer is larger than a parasitic capacitance occurring between the protection element and the another elongated conductor, and an interval between the conductive layer and the another elongated conductor is shorter than an interval between the another elongated conductor and the protection element.

2. The protection device according to claim 1,
wherein the parasitic capacitance occurring between the elongated conductor and the conductive layer is larger than a parasitic capacitance occurring between the protection element and the conductive layer.

3. The protection device according to claim 1,
wherein the protection element includes a Zener diode.

4. The protection device according to claim 3,
wherein the protection element further includes a thyristor.

5. The protection device according to claim 2,
wherein the interval between the conductive layer and the elongated conductor is shorter than an interval between the conductive layer and the protection element.

6. The protection device according to claim 1,
wherein the passive element and the conductive layer are separated from each other and opposed to each other inside the insulating layer, and form a capacitor because of a parasitic capacitance occurring between the passive element and the conductive layer.

7. The protection device according to claim 1,
wherein the passive element is commensurate in size with the conductive layer, is located directly opposed to the conductive layer, and is in the plane that is parallel with the conductive layer.

* * * * *